(12) United States Patent
Morimoto et al.

(10) Patent No.: US 8,470,145 B2
(45) Date of Patent: Jun. 25, 2013

(54) CATHODE UNIT AND SPUTTERING APPARATUS PROVIDED WITH THE SAME

(75) Inventors: Naoki Morimoto, Shizuoka (JP); Tomoyasu Kondo, Shizuoka (JP); Daisuke Mori, Shizuoka (JP); Kyuzo Nakamura, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 240 days.

(21) Appl. No.: 12/991,777

(22) PCT Filed: Jun. 23, 2009

(86) PCT No.: PCT/JP2009/061397
§ 371 (c)(1),
(2), (4) Date: Nov. 9, 2010

(87) PCT Pub. No.: WO2009/157438
PCT Pub. Date: Dec. 30, 2009

(65) Prior Publication Data
US 2011/0056829 A1    Mar. 10, 2011

(30) Foreign Application Priority Data
Jun. 26, 2008    (JP) .................. 2008-167175

(51) Int. Cl.
*C23C 14/35*    (2006.01)

(52) U.S. Cl.
USPC ............ 204/298.12; 204/298.16; 204/298.18; 204/298.19; 204/298.26

(58) Field of Classification Search
USPC ............ 204/298.12, 298.06, 298.16, 298.18, 204/298.19, 298.14, 298.26
See application file for complete search history.

(56) References Cited

U.S. PATENT DOCUMENTS

| | | | |
|---|---|---|---|
| 5,482,611 A | 1/1996 | Helmer et al. | |
| 6,352,629 B1 * | 3/2002 | Wang | 204/298.2 |
| 6,413,392 B1 * | 7/2002 | Sahoda et al. | 204/298.18 |
| 2006/0207873 A1 | 9/2006 | Fu | |

FOREIGN PATENT DOCUMENTS

| | | | |
|---|---|---|---|
| JP | 57-079170 A | | 5/1982 |
| JP | 57-158381 A | | 9/1982 |
| JP | 60-181268 A | | 9/1985 |
| JP | 60-224775 A | | 11/1985 |
| JP | 62-7855 A | | 1/1987 |
| JP | 62-260055 A | | 11/1987 |
| JP | 2-175864 A | | 7/1990 |
| JP | 6-93442 A | | 4/1994 |
| JP | 06-200375 | * | 7/1994 |
| JP | 7-183219 A | | 7/1995 |
| JP | 2008-47661 A | | 2/2008 |

OTHER PUBLICATIONS

Machine Translation of JP 06-200375 dated Jul. 1994.*
Office Action from Chinese Patent Application No. 200980123899.3 (Nov. 24, 2011).
International Search Report for PCT Patent App. No. PCT/JP2009/061397 (Sep. 29, 2009).
Office Action from Singapore Patent App. No. 201008871-4 (Jul. 31, 2012).

* cited by examiner

*Primary Examiner* — Rodney McDonald
(74) *Attorney, Agent, or Firm* — Cermak Nakajima LLP; Tomoko Nakajima (57) ABSTRACT

There is provided an inexpensive cathode unit which is simple in construction and is capable of forming a film at good coating characteristics relative to each of micropores of high aspect ratio throughout an entire surface of a substrate. There is also provided a sputtering apparatus provided with the cathode unit. The cathode unit of this invention has a holder formed with one or more recessed portions on one surface thereof. Inside the recessed portions there are mounted bottomed cylindrical target members from the bottom side thereof. Into a space inside each of the target members there are built magnetic field generating means for generating magnetic fields.

8 Claims, 5 Drawing Sheets

CATHODE UNIT AND SPUTTERING APPARATUS PROVIDED WITH THE SAME

This application is a national phase entry under 35 U.S.C. §371 of PCT Patent Application No. PCT/JP2009/061397, filed on Jun. 23, 2009, which claims priority under 35 U.S.C. §119 to Japanese Patent Application No. 2008-167175, filed Jun. 26, 2008, both of which are incorporated by reference.

TECHNICAL FIELD

The present invention relates to a cathode unit to be used in forming a film on a surface of a substrate to be processed, and relates to a sputtering apparatus provided with the cathode unit.

BACKGROUND ART

Conventionally, a sputtering apparatus was used in the film-forming step in manufacturing, e.g., semiconductor devices. As a result of recent trends for micro-fine wiring patterns, the sputtering apparatus to be used for this kind of use is strongly required to be able to perform film forming at good coating characteristics relative to the micropores of high aspect ratio over the entire surfaces of the substrate to be processed, i.e., to improve the coverage.

Generally, in the above-mentioned sputtering apparatus, magnet assembly having provided therein a plurality of magnets are disposed, e.g., behind the target (the side lying opposite to the sputtering surface) by alternately changing the polarity. By means of this magnet assembly a tunnel-shaped magnetic field is caused to be generated in front of the target (on the side of the sputtering surface). Electrons ionized in front of the target and secondary electrons generated by the sputtering are collected. Plasma density is thus increased by increasing the electron density in front of the target.

In this kind of sputtering apparatus the target is preferentially sputtered in the region, out of the entire target, to be affected by the magnetic field. Therefore, if the above-mentioned region is present, e.g., in the neighborhood of the center of the target from the viewpoint of stability of discharging and the improvement in the utilization efficiency of the target, the amount of erosion of the target at the time of sputtering becomes large near the center thereof. In such a case, in the peripheral portion of the substrate, the particles of the target member sputtered from the target (e.g., metal particles, hereinafter referred to as "sputtered particles") are incident at an inclined angle and get deposited thereon. As a result, in case the conventional sputtering apparatus is used for the above-mentioned film forming, there has conventionally been known that a problem arises of asymmetry in coverage especially in the peripheral portion of the substrate.

In order to solve this kind of problem, there is known in patent document 1 a sputtering apparatus in which: a first sputtering target is disposed above a stage on which is mounted a substrate inside a vacuum chamber substantially in parallel with the surface of the stage; and a second sputtering target is disposed at an angle to the surface of the stage slantingly above the stage, i.e., a sputtering apparatus which is provided with a plurality of cathode units.

However, if a plurality of cathode units are disposed inside the vacuum chamber as described in the above-mentioned patent document 1, there are disadvantages in that the arrangement of the apparatus becomes complicated and that the cost becomes high due to an increased number of parts because the sputtering power supply becomes necessary depending on the number of targets.

Patent Document 1: JP-A-2008-47661

DISCLOSURE OF THE INVENTION

Problems to be Solved by the Invention

In view of the above-mentioned problems, this invention has a problem of providing a cathode unit which is simple in apparatus construction and inexpensive so as to be capable of forming a film at good coverage over the entire surface of the substrate relative to each of the micropores (via holes) of high aspect ratio. This invention has also a problem of providing a sputtering apparatus which is provided with the cathode unit.

Means for Solving the Problems

In order to solve the above-mentioned problems, the cathode unit according to this invention comprises a holder in which one or more recessed portions are formed on one surface of the holder. A target member of a bottomed cylindrical shape is mounted from the bottom side thereof into the recessed portion or each of the recessed portions. Magnetic field generating means for generating a magnetic field in a space inside the target member is built into the recessed portion or each of the recessed portions.

According to this invention, the cathode unit is mounted in the vacuum chamber of the sputtering apparatus. After having evacuated the vacuum chamber, a sputtering gas such as a rare gas and the like is introduced into the vacuum chamber and, e.g., a predetermined negative potential is charged to the cathode unit. Then, glow discharge takes place from the space in front of the cathode unit to the space inside the target member. The magnetic field generated by the magnetic field generating means causes to contain the plasma into the space inside the target member (especially, the secondary electrons generated by the sputtering tend to be contained). In this state, if the introduction of the sputtering gas is stopped, self-discharging tends to take place due to pressure decrease in the space inside the target member. Then, the sputtering gas ions and the like in the plasma collide with the inner wall surfaces of the target member and get sputtered. The sputtered particles generated by the sputtering and the ions of the sputtered particles are discharged to the space in front of the cathode unit with strong rectilinear characteristics out of the openings of the target member.

Therefore, if the substrate is disposed so as to lie opposite to the cathode unit inside the vacuum chamber, those portions of the substrate which lie opposite to the openings of the target member and the surroundings of the openings will be subjected to film formation with extremely high uniformity in film thickness. In other words, there will be limited the incidence and deposition at an inclined angle relative to the surface of the substrate. As a result, if the sputtering apparatus according to this invention is used in the film forming step in the manufacturing of semiconductor devices, film can be formed at good coating characteristics relative to the micropores of high aspect ratio. In order to make the self-discharging to continue surely in the space inside the target member, it is preferable to generate the magnetic field at a magnetic field strength of 500 Gauss or more.

According to this invention, preferably, the recessed portions are formed each in an identical opening diameter throughout an entire surface of the holder at a predetermined distance from one another. The magnetic field generating means are bar-shaped magnets which are each disposed in a depth direction of the recessed portions on a line connecting the center of each of the recessed portions adjoining each other. The holder has, on a surface lying opposite to the surface in which the recessed portions are formed, housing holes capable of housing therein the magnets. Film can be formed at good coating characteristics throughout the entire surface of the substrate relative to the micropores of high aspect ratio. In other words, the problem of asymmetry of coverage can be resolved and the in-plane uniformity can be improved. In addition, only by inserting in position the target members and the magnets into the recessed portions and the housing holes, respectively, the cathode unit can advantageously be assembled with ease.

On the other hand, preferably, the recessed portions are each formed with an identical opening diameter throughout an entire surface of the holder at a predetermined distance from one another of the recessed portions. The magnetic field generating means are ring-shaped magnets enclosing each of the recessed portions. Annular housing grooves capable of containing therein the magnets are formed, within the holder, on a surface lying opposite to the surface in which the recessed portions are formed.

Preferably, each of the magnets is mounted on an integral supporting plate and is so constructed and arranged that, when the supporting plate is coupled to the surface of the holder lying opposite to the surface in which the recessed portions are formed, each of the magnets is held by insertion into the respective housing holes or housing grooves so as to be disposed on a periphery of each of the recessed portions. Then, the assembling of the cathode unit becomes far easier.

According to another aspect of this invention, there is provided a sputtering apparatus comprising: the cathode unit according to any one of claims 1 through 4; a vacuum chamber for disposing therein the cathode unit; a gas introduction means for introducing a predetermined sputtering gas into the vacuum chamber; and a sputtering power supply for supplying power to the cathode unit.

According to this invention, instead of providing the sputtering apparatus itself with a plurality of cathode units like in the above-mentioned conventional art, the film can be formed with high uniformity in film thickness with one cathode unit. Therefore, as compared with the case in which the apparatus arrangement is modified to use a plurality of cathode units, the arrangement of this invention is simpler and the cost for manufacturing the apparatus can be reduced.

In this case, the sputtering apparatus preferably comprises a coil disposed around a wall surface of the vacuum chamber about a reference axis which connects the cathode unit and the substrate; and a power supply apparatus supplying power to each of the coils. Then, a vertical magnetic field can be generated such that, by supplying electric power to the coil, vertical lines of magnetic force pass through the cathode unit and the entire surface of the substrate at a uniform distance from one another. If the film is formed in this state, the sputtered particles from the target member can be changed in their direction by the above-mentioned vertical magnetic field so that the sputtered particles tend to be incident substantially vertically to the substrate and get deposited thereon. As a result, if the sputtering apparatus of this invention is used in the film-forming step in manufacturing semiconductor devices, film forming can be performed at better coating characteristics throughout the entire surface of the substrate relative to the micropores of high aspect ratio.

BEST MODE FOR CARRYING OUT THE INVENTION

Figure 1:
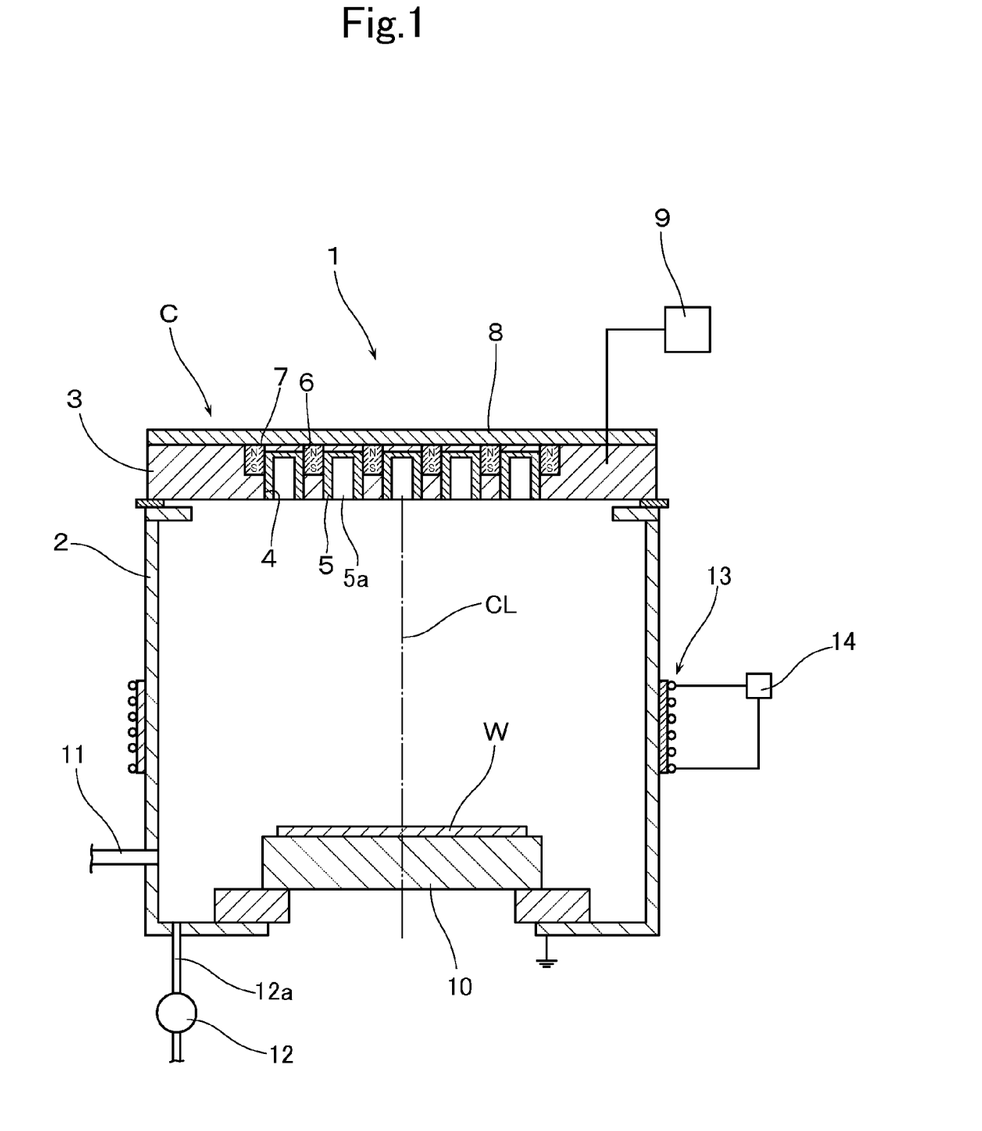
FIG. 1 is a schematic sectional view of a sputtering apparatus provided with a cathode unit according to an embodiment of this invention.

With reference to the drawings, a description will now be made of a sputtering apparatus provided with a cathode unit according to an embodiment of this invention. As shown in FIG. 1, the sputtering apparatus 1 is provided with a vacuum chamber 2 which is capable of forming therein a vacuum atmosphere. On the ceiling portion of the vacuum chamber 2, there is mounted a cathode unit C. In the following description, the side of the ceiling of the vacuum chamber 2 is defined as "upper" side and the bottom side thereof is defined as "lower" side.

Figure 2:
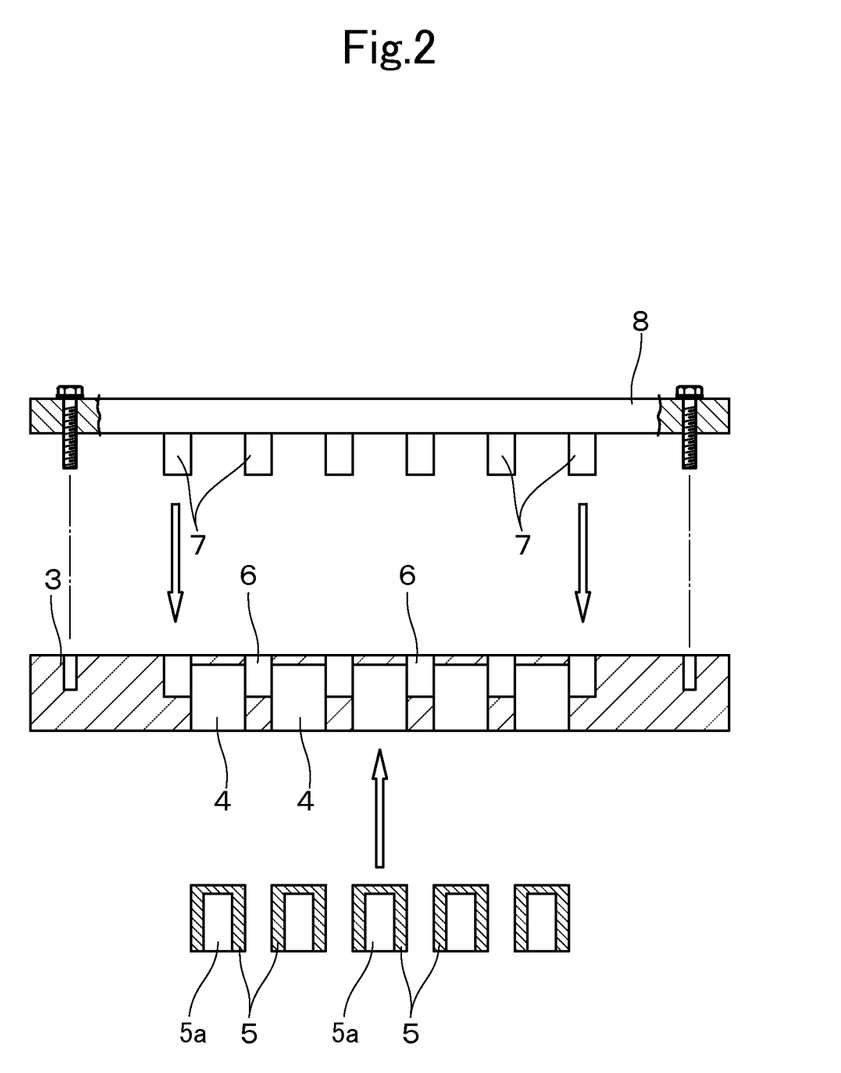
FIG. 2 is an exploded sectional view of the cathode unit.
Figure 3:
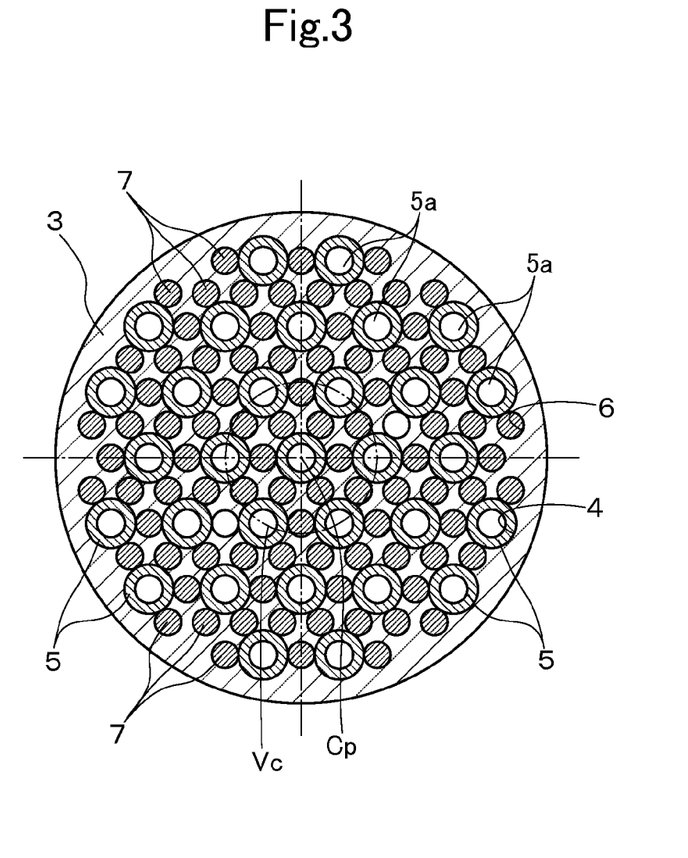
FIG. 3 is a cross-sectional view of the cathode unit.

As shown in FIGS. 2 and 3, the cathode unit C is provided with a disk-like holder 3 which is made of an electrically conductive material, e.g., a material that is the same as that of the target member (about which reference is made hereinafter). The lower surface of the holder 3 has formed therein a plurality of recessed portions 4 which are circular as seen in plan view and which are of the same opening area. In this embodiment, one recessed portion 4 is formed first in a manner concentric with the center Cp of the holder 3, and six recessed portions 4 are formed on the periphery of the recessed portion, which serves as a reference, on the same imaginary circle Vc at an equal distance from one another. Then, with each of the above-mentioned recessed portions 4 on the imaginary circle Vc of the same diameter serving as a further reference, it is so arranged that six more recessed portions 4 inclusive of the recessed portion 4 on the center are formed on the periphery of the further reference on the imaginary circle of the same diameter at an equal distance from one another. In this manner, recessed portions are kept on being formed until no more recessed portions 4 can be formed on a diametrically outside of the holder 3. According to this arrangement, a large number of recessed portions 4 are densely formed throughout an entire surface of the holder 3.

The area of opening of each of the recessed portions 4 is set to a range of 20 to 60 mm in diameter. Accordingly, the area on the lower surface of the holder 3 is sized such that the center of the recessed portion 4 that is positioned diametrically outermost of the holder 3 is positioned diametrically inside of the outer periphery of the substrate W. Further, the distance in the diametrical direction between each of the recessed portions 4 is set larger than the diameter of the cylindrical magnet which is described hereinafter and is set to a range within which the strength of the holder 3 can be maintained. Each of the recessed portions 4 has inserted therein a target member 5.

The target member 5 is made of a material appropriately selected depending on the composition of the thin film that is going to be formed on the substrate W to be processed, e.g., made of Cu, Ti or Ta, and has an external shape of a bottomed cylinder so that a discharging space can be present inside thereof. The target member 5 is then detachably fitted into each of the recessed portions 4 starting with, or from, the side of the bottom portion of the target member 5. At this time, the length of the target member 5 is set such that the lower surface of the target member 5 is flush with the lower surface of the holder 3. In addition, after having fitted the target member 5 into each of the recessed portions 4, a mask plate (not illustrated) having an opening smaller than the opening area of the target member 5 is attached to the lower surface of the holder 3. It is thus so arranged that, when the cathode unit C is mounted on the ceiling portion of the vacuum chamber 2, each of the target members 5 will not be detached off from the respective recessed portion 4. In this case, the mask plate may be made of the same material as that, e.g., of the target member 5.

On an upper surface of the holder 3 there are formed a plurality of housing holes 6 which extend in the thickness direction of the holder so that bar-shaped magnets 7 formed into a columnar shape or into a prism shape can be inserted thereinto. In this embodiment, the housing holes 6 are formed such that six magnets 7 are positioned on the periphery of one recessed portion at an equal distance from one another and are positioned on the line connecting the centers of the respectively adjoining recessed portions 4 (see FIG. 3). Further, the depth of each of the housing holes 6 from the upper surface of the holder 3 is set such that the magnet 7 is positioned at least to the depth of one-third from the bottom of the target member 5.

Each of the magnets 7 is designed so as to generate a strong magnetic field of 500 Gauss or more in the space 5a inside the target member 5 when each magnet is disposed on the periphery of each of the recessed portions 4, and is vertically disposed in a given position of the disk-shaped supporting plate 8 with the polarity coinciding with each other (e.g., with the polarity on the side of the supporting plate 8 being defined as N pole). Then, when the supporting plate 8 is coupled with the upper surface of the holder 3, each of the magnets 7 is inserted into each of the respective housing holes 6, and the magnet 7 is disposed around each of the recessed portions 4. The supporting plate 8 is also made of an electrically conductive material and, after having coupled the two members together, they are fixed by means of a fixing means (not illustrated) such as bolts and nuts, and the like. It may be so arranged that a mechanism to circulate a coolant through the inside space of the supporting plate 8 is provided and, during sputtering, the supporting plate serves the purpose of a backing plate which cools the holder 3 into which the target member 5 has been disposed by insertion.

The cathode unit C is electrically connected to a DC power supply (sputtering power supply) 9 of a known construction so that a predetermined negative potential is charged. Further, in the bottom portion of the vacuum chamber 2, there is disposed a stage 10 in a manner to lie opposite to the cathode unit C so that the substrate W to be processed such as a silicon wafer and the like can be held in position. Further, to the side wall of the vacuum chamber 2, there is connected a gas pipe 11 which introduces a sputtering gas such as argon gas and the like. The other end of the gas pipe is in communication with a gas source through a mass flow controller (not illustrated). The vacuum chamber 2 has connected thereto an exhaust pipe 12a which is communicated with an evacuating means 12 which is made up of a turbo molecular pump, a rotary pump, and the like (see FIG. 1).

A description will now be made of film forming using the above-mentioned sputtering apparatus 1. In the following example, as the substrate W on which a film is formed, there was used one in which, after having formed a silicon oxide film (electrically insulating film) on the surface of the Si wafer, micropores for wiring were formed inside the silicon oxide film by patterning in a known method. A Cu film which serves as a seed film was then formed by sputtering.

First, the target member 5 is fitted into each of the recessed portions 4 on the lower surface of the holder 3. At the same time, the supporting plate 8 on which the magnets 7 have been vertically disposed is brought into abutment with the upper surface of the holder 3 in such a manner that each of the magnets 7 is inserted into the respective housing holes 6. By means of bolts and nuts (not illustrated), the abutted portion is fixed to thereby assemble the cathode unit C. Then, the cathode unit C is attached to the ceiling portion of the vacuum chamber 2.

Subsequently, after having mounted the substrate W on the stage 3 that lies opposite to the cathode unit 3, the vacuum exhaust means 12 is operated to evacuate the vacuum chamber 2 to a predetermined vacuum degree (e.g., $10^{-5}$ Pa). Then, once the pressure inside the vacuum chamber 2 has reached a predetermined value, a predetermined negative potential is charged (electric power is supplied) from the DC power supply 9 to the cathode unit C while introducing a sputtering gas such as argon gas and the like into the vacuum chamber 2 in a predetermined flow amount.

Figure 4:
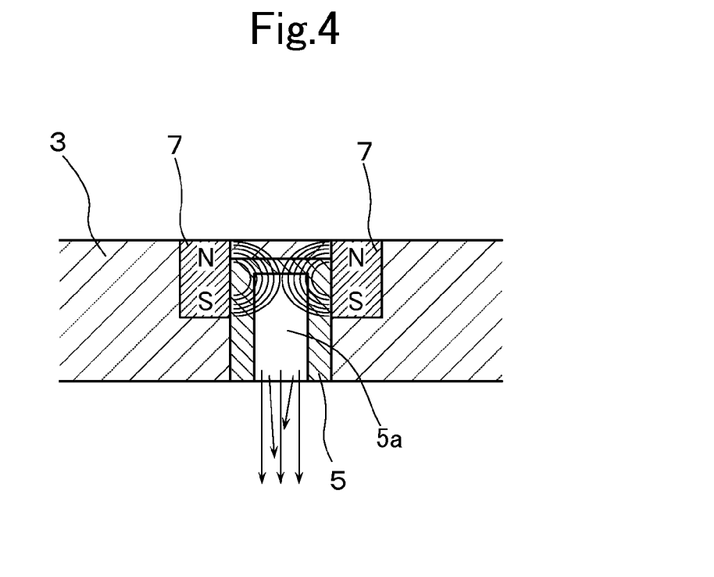
FIG. 4 is a partly enlarged sectional view explaining the sputtering in the space inside the target member.

When the negative potential is charged to the cathode unit C, glow discharging takes place from the space 5a of each of the target members 5 inside the holder 3 toward the space in front of the cathode unit C. At this time, by means of the magnetic field generated by the magnets 7, plasma is contained to the space 5a. If the introduction of the sputtering gas is stopped in this state, self-discharging comes to take place in the space 5a. Argon ions and the like in the plasma get collided with the inner wall surfaces of the target members 5, thereby causing sputtering to take place. The Cu atoms get splashed, and the Cu atoms and the ionized Cu ions are discharged toward the substrate W with strong rectilinear characteristics from the opening at the lower surface of each of the target members 5 (see FIG. 4).

As a result, at the position right below each of the target members 5 (i.e., in the region lying opposite to the opening of the target members 5 inclusive of the peripheral portions thereof), film forming takes place with an extremely high film thickness uniformity. Since these target members 5 are positioned relatively close to each other, film forming can be performed at good coating characteristics relative to the micropores of high aspect ratio throughout the entire surfaces of the substrate W. In other words, the problem of asymmetry of coverage is resolved and the in-plane uniformity is improved.

As described hereinabove, this invention is unlike the prior art in which a plurality of cathode units are disposed on the sputtering apparatus itself. Therefore, since a single cathode unit C is capable of solving the problem, the construction is simple as compared with the case in which the apparatus constitution must be modified to use a plurality of cathode units. In addition, the manufacturing cost of the apparatus can be kept low.

Figure 5:
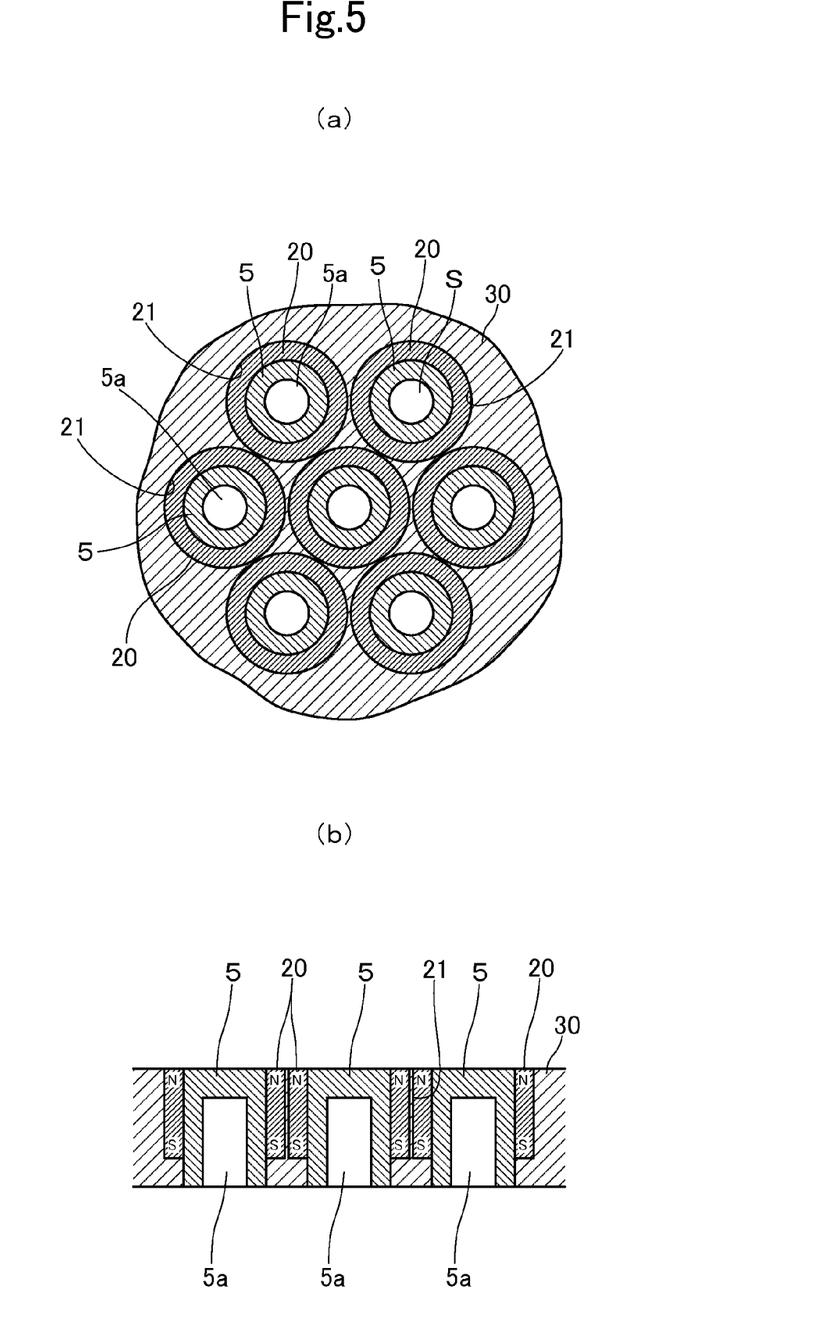
FIGS. 5(a) and 5(b) are sectional views explaining the cathode unit relating to a modified example.

In this embodiment, a description has been made of an example in which bar-shaped magnets 5a were used as the magnets 7. However, as long as the strong magnetic field above 500 Gauss is formed in the space 5a of the target member 5, it does not matter how it is brought into practice. As shown in FIGS. 5(a) and 5(b), ring-shaped magnets 20 may be used so that the space 5a of the target member 5 is enclosed by the target member 5. In this case, there may be provided on an upper surface of the holder 30 annular housing grooves 21 which are capable of housing ring-shaped magnets 20. On the other hand, two bar-shaped magnets may be inserted into the housing hole 6 in a state in which they are placed one on top of the other with the polarity on the side of the target member 5 reciprocally changed. It may thus be so arranged that the magnetic field is generated by the pair of upper and lower magnets in the space 5a of the target member 5 (see FIG. 6).

Further, a description has so far been made of an example in which the target member 5 is detachably inserted in the holder 3 considering the mass productivity and the utilization efficiency of the target. It may however be so arranged that the holder 3 itself serves the purpose of the target. In other words, only the recessed portions are formed on the lower surface of the holder 3, and magnets are housed on the periphery of each of the recessed portions so that the inner wall surfaces of the recessed portions may get sputtered.

Further, in the sputtering apparatus of this embodiment, an arrangement may be made such that a coil 13 and a power supply apparatus 14 to enable power supply to the coil 13 are provided on an outside wall surface of the vacuum chamber about a reference axis CL which connects the cathode unit C and the center of the substrate W (FIG. 1), and that a vertical magnetic field is generated so that vertical forces of magnetic lines pass from the cathode unit C through the entire surface of the substrate W, thereby performing film forming.

According to this arrangement, the sputtered particles from the target member 5 are changed in their direction by the above-mentioned vertical magnetic field, so that the sputtered particles tend to be incident substantially vertical relative to the substrate W and get deposited thereon. As a result, if the sputtering apparatus of this invention is used in the film forming step of manufacturing the semiconductor device, film forming can be made at still better coating characteristics throughout the entire surface of the substrate relative to the micropores of high aspect ratio.

Further, in case a high frequency power supply (not illustrated) of a known construction is electrically connected to the stage so that, during sputtering, a predetermined bias potential can be applied to the stage 10 and consequently to the substrate W to thereby form a Cu seed layer, Cu ions may be positively drawn to the substrate to thereby increase the sputtering rate.

Example 1

In Example 1, a Cu film was formed by using the sputtering apparatus shown in FIG. 1. As the substrate W, there was used one in which, after having formed a silicon oxide film throughout the entire surface of the Si wafer of 300 mm in diameter, the silicon oxide film was subjected to patterning to thereby form micropores (40 nm in width, 140 nm in depth) in the silicon oxide film in a known method.

Figure 6:
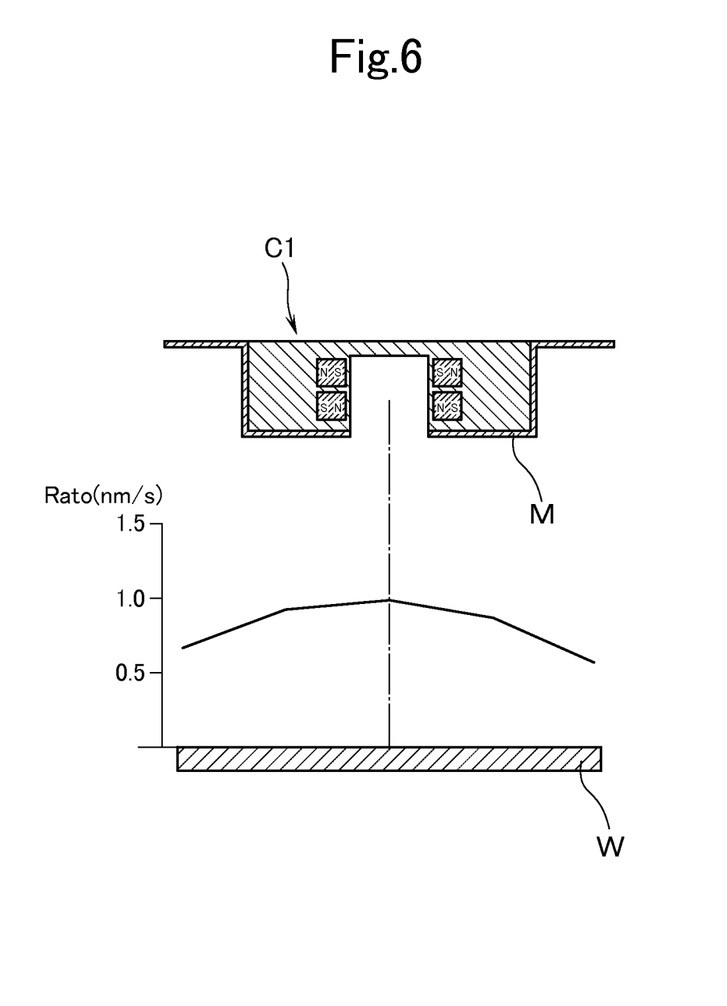
FIG. 6 is a sectional view explaining the cathode unit employed in Example 1.

As the cathode unit, as shown in FIG. 6, there was used a holder made of copper in a composition ratio of 99% and 200 mm in diameter. In the bottom central portion of the cathode unit, a recessed portion was formed into an opening of 40 mm in diameter and a depth of 50 mm, so as to perform a dual function also of the target member. On the periphery of the recessed portion, six magnet units were built in circumferentially at an equal distance to one another, thus making the cathode unit C1 of Example 1. In this case, the magnet units were arranged such that two magnets were disposed by laying one on top of the other in a vertical direction so that magnets are present substantially throughout the entire depth length of the recessed portion while alternately changing the polarity on the side of the target member 5 (magnet on the lower side has N-pole and the magnet on the upper side has S-pole). In this manner, a magnetic field of 500 Gauss was generated in the space of the recessed portion. After having mounted the cathode unit C1 that has been thus manufactured, on the ceiling portion of the vacuum chamber 2, the bottom surface of the holder exclusive of the opening of the recessed portion was covered by mounting in position the mask member M.

As the film-forming conditions, the distance between the lower surface of the holder and the substrate was set to 300 mm, the electric power to be charged to the target was set to 8 kW (electric current 17.5 A), and the sputtering time was set to 60 seconds, thereby performing a Cu film-forming.

FIG. 6 shows also the distribution of the sputtering rate taken in the diametrical direction of the substrate when the film was formed under the above-mentioned conditions. According to the above, there was obtained an equivalent sputtering rate from the center of the substrate to half the position as seen in the diametrical direction thereof (0.97 nm/s at the substrate center; 0.90 and 0.86 nm/s at the position of 75 mm from the substrate center). It can thus be seen that the uniformity of film thickness distribution is extremely high at the position right below the opening of the holder 3 and on the periphery thereof. Further, when the coverage of the micropores was confirmed by SEM pictures, it was confirmed that, at the above-mentioned positions, the problem of asymmetry has been resolved as a result of forming dense thin films on the wall surfaces of the micropores, and that the in-plane uniformity has been improved.

DESCRIPTION OF REFERENCE NUMERALS AND CHARACTERS 1 sputtering apparatus
2 vacuum chamber
C, C1 cathode unit
4 recessed portion
5 target member
5a space for electric discharging
6 housing hole
7 magnet (magnetic field generating means)
9 DC power supply
11 gas pipe (gas introduction means)
12 evacuating means
W substrate

What is claimed is:
1. A cathode unit comprising:
a holder having formed on one surface thereof a plurality of recessed portions, the holder being adapted to receive in each of the plurality of the recessed portions a target member of a bottomed cylindrical shape from the bottom side thereof; and
magnetic field generating means for generating a magnetic field in a space inside the target member or each of the target members placed in the recessed portions,
wherein the plurality of the recessed portions are each formed in an identical opening diameter throughout an entire surface of the holder at a predetermined distance from each other,
wherein the magnetic field generating means is made up of bar-shaped magnets which are disposed in a depth direction of the recessed portions on a line connecting the center of each of the recessed portions adjoining each other, and
wherein the holder has, on a surface lying opposite to the surface in which the recessed portions are formed, housing holes capable of housing therein the magnets.
2. The cathode unit according to claim 1, wherein each of the magnets is mounted on an integral supporting plate and is so constructed and arranged that, when the supporting plate is coupled to the surface of the holder lying opposite to the surface in which the recessed portions are formed, each of the magnets is held by insertion into the housing holes so as to be disposed on a periphery of each of the recessed portions.

3. A sputtering apparatus comprising:
the cathode unit according to claim 2;
a vacuum chamber for disposing therein the cathode unit;
a gas introduction means for introducing a predetermined sputtering gas into the vacuum chamber; and
a sputtering power supply for supplying power to the cathode unit.

4. A sputtering apparatus comprising:
the cathode unit according to claim 1;
a vacuum chamber for disposing therein the cathode unit;
a gas introduction means for introducing a predetermined sputtering gas into the vacuum chamber; and
a sputtering power supply for supplying power to the cathode unit.

5. A cathode unit comprising:
a holder having formed on one surface thereof a plurality of recessed portions, the holder being adapted to receive in each of the plurality of the recessed portions a target member of a bottomed cylindrical shape from the bottom side thereof; and
magnetic field generating means for generating a magnetic field in a space inside the target member or each of the target members placed in the recessed portions,
wherein the plurality of the recessed portions are each formed with an identical opening diameter throughout an entire surface of the holder at a predetermined distance from one another of the recessed portions,
wherein the magnetic field generating means are ring-shaped magnets surrounding each of the recessed portions, and
wherein annular housing grooves capable of containing therein the magnets are formed, within the holder, on a surface lying opposite to the surface in which the recessed portions are formed.

6. The cathode unit according to claim 5, wherein each of the magnets is mounted on an integral supporting plate and is so constructed and arranged that, when the supporting plate is coupled to the surface of the holder lying opposite to the surface in which the recessed portions are formed, each of the magnets is held by insertion into the housing groove so as to be disposed on a periphery of each of the recessed portions.

7. A sputtering apparatus comprising:
the cathode unit according to claim 6;
a vacuum chamber for disposing therein the cathode unit;
a gas introduction means for introducing a predetermined sputtering gas into the vacuum chamber; and
a sputtering power supply for supplying power to the cathode unit.

8. A sputtering apparatus comprising:
the cathode unit according to claim 5;
a vacuum chamber for disposing therein the cathode unit;
a gas introduction means for introducing a predetermined sputtering gas into the vacuum chamber; and
a sputtering power supply for supplying power to the cathode unit.

* * * * *